US010923322B2

United States Patent
Lopez et al.

(10) Patent No.: US 10,923,322 B2
(45) Date of Patent: Feb. 16, 2021

(54) ARTICULATED DIRECT-MOUNT INDUCTOR AND ASSOCIATED SYSTEMS AND METHODS

(71) Applicant: Lam Research Corporation, Fremont, CA (US)

(72) Inventors: Oscar Lopez, San Jose, CA (US); Shen Peng, Dublin, CA (US); David Setton, Danville, CA (US); Craig Rosslee, San Jose, CA (US); Dan Marohl, San Jose, CA (US); Andras Kuthi, Thousand Oaks, CA (US)

(73) Assignee: Lam Research Corporation, Fremont, CA (US)

( * ) Notice: Subject to any disclaimer, the term of this patent is extended or adjusted under 35 U.S.C. 154(b) by 530 days.

(21) Appl. No.: 15/623,356

(22) Filed: Jun. 14, 2017

(65) Prior Publication Data

US 2018/0366301 A1    Dec. 20, 2018

(51) Int. Cl.
*H01J 37/32*    (2006.01)
*H01F 27/28*    (2006.01)
(Continued)

(52) U.S. Cl.
CPC ........ *H01J 37/32183* (2013.01); *H01F 27/24* (2013.01); *H01F 27/2847* (2013.01); *H01F 27/2852* (2013.01); *H01F 27/292* (2013.01); *H01F 27/346* (2013.01); *H01F 27/40* (2013.01); *H01F 41/06* (2013.01); *H03H 3/00* (2013.01); *H03H 7/38* (2013.01)

(58) Field of Classification Search
CPC ............. H01F 27/2857; H01F 27/2852; H01F 27/2861
See application file for complete search history.

(56) References Cited

U.S. PATENT DOCUMENTS

| 2,882,507 A | 4/1959 | Holz |
| 5,392,018 A | 2/1995 | Collins et al. |
| (Continued) |

FOREIGN PATENT DOCUMENTS

| FR | 2 926 393 A1 | 7/2009 |
| JP | 2002033220 A | 1/2002 |
| JP | 2005093451 A | 4/2005 |

*Primary Examiner* — Livius R. Cazan
(74) *Attorney, Agent, or Firm* — Penilla IP, APC

(57) ABSTRACT

A coil portion is formed. A first articulation portion extends from the coil portion. A first mounting structure extends from the first articulation portion. The first mounting structure includes a first mounting region configured to mount in contact with a terminal of a first electrical component. The first articulation portion and the first mounting structure are configured to position the first mounting region at a location outside of a strong electromagnetic field emanating from the coil portion. A second articulation portion extends from the coil portion. A second mounting structure extends from the second articulation portion. The second mounting structure includes a second mounting region configured to mount in contact with a terminal of a second electrical component. The second articulation portion and the second mounting structure are configured to position the second mounting region at a location outside of the strong electromagnetic field emanating from the coil portion.

16 Claims, 10 Drawing Sheets

(51) Int. Cl.
*H01F 27/29* (2006.01)
*H03H 3/00* (2006.01)
*H03H 7/38* (2006.01)
*H01F 27/40* (2006.01)
*H01F 27/34* (2006.01)
*H01F 27/24* (2006.01)
*H01F 41/06* (2016.01)

(56) References Cited

U.S. PATENT DOCUMENTS

| | | |
|---|---|---|
| 7,914,294 B2 * | 3/2011 | Kumar et al. |
| 2017/0004955 A1 | 1/2017 | Leeser |
| 2017/0069464 A1 | 3/2017 | Ye et al. |

* cited by examiner

⎯ 601

Provide an articulated direct-mount inductor configured to directly connect to at least two electrical components at respective locations outside of a strong electromagnetic field emanating from a coil portion of the articulated direct-mount inductor during operation.

⎯ 603

Connect the articulated direct-mount inductor directly to the at least two electrical components.

Fig. 6

ARTICULATED DIRECT-MOUNT INDUCTOR AND ASSOCIATED SYSTEMS AND METHODS

BACKGROUND

1. Field of the Invention

The present invention relates to semiconductor device fabrication.

2. Description of the Related Art

In various semiconductor fabrication processes, radiofrequency power is transmitted to a processing chamber to generate plasma and/or generate bias voltage and/or produce some other desired effect. The radiofrequency power is generated by a radiofrequency power supply and is transmitted through an impedance matching system in route to the processing chamber. Generally speaking, the impedance matching system is configured to ensure that a load impedance seen by the radiofrequency power supply is sufficient close to a load impedance for which the radiofrequency power supply is designed, so that radiofrequency power will be efficiently transmitted to the load within the processing chamber without unacceptable radiofrequency signal reflection and/or loss. Transmission of the radiofrequency power through the impedance matching system can cause heating of components within the impedance matching system that must be managed to avoid thermally-induced damage. It is within this context that the present invention arises.

SUMMARY

In an example embodiment, an articulated direct-mount inductor is disclosed. The articulated direct-mount inductor includes a coil portion of an electrically conductive material. The articulated direct-mount inductor also includes a first articulation portion of the electrically conductive material extending from the coil portion. The articulated direct-mount inductor also includes a first mounting structure of the electrically conductive material extending from the first articulation portion. The first mounting structure includes a first mounting region configured to mount in physical and electrical contact with a terminal of a first electrical component. The first articulation portion and the first mounting structure are collectively configured to position the first mounting region at a location outside of a strong electromagnetic field emanating from the coil portion when radiofrequency power is transmitted through the articulated direct-mount inductor. The articulated direct-mount inductor also includes a second articulation portion of the electrically conductive material extending from the coil portion. The articulated direct-mount inductor also includes a second mounting structure of the electrically conductive material extending from the second articulation portion. The second mounting structure includes a second mounting region configured to mount in physical and electrical contact with a terminal of a second electrical component. The second articulation portion and the second mounting structure are collectively configured to position the second mounting region at a location outside of the strong electromagnetic field emanating from the coil portion when radiofrequency power is transmitted through the articulated direct-mount inductor.

In an example embodiment, a method is disclosed for configuring an impedance matching system. The method includes providing an articulated direct-mount inductor configured to directly connect to at least two electrical components at respective locations outside of a strong electromagnetic field emanating from a coil portion of the articulated direct-mount inductor when radiofrequency power is transmitted through the articulated direct-mount inductor. The articulated direct-mount inductor includes a first articulation portion extending from the coil portion to a first mounting portion. The articulated direct-mount inductor also includes a second articulation portion extending from the coil portion to a second mounting structure. The method also includes connecting the articulated direct-mount inductor directly to the at least two electrical components.

In an example embodiment, a method is disclosed for manufacturing an articulated direct-mount inductor. The method includes laying out an entirety of the articulated direct-mount inductor in a planar form on a planar sheet of electrically conductive material. The articulated direct-mount inductor in its planar form includes a rectangular-shaped region, and a first mounting structure region located at a first end of the rectangular-shaped region, and a second mounting structure region located at a second end of the rectangular-shaped region. The method also includes cutting out the entirety of the articulated direct-mount inductor in its planar form from the planar sheet of electrically conductive material. The method also includes wrapping a portion of the rectangular-shaped region of the articulated direct-mount inductor in its planar form around a core formation structure to form a helical-shaped coil portion. The method also includes removing the core formation structure from within the helical-shaped coil portion. The method also includes bending a portion of the articulated direct-mount inductor in its planar form between the helical-shaped coil portion and the first mounting structure region to form a first articulation portion. The method also includes bending a portion of the articulated direct-mount inductor in its planar form between the helical-shaped coil portion and the second mounting structure region to form a second articulation portion. The first articulation portion and the second articulation portion are formed to enable connection of the first mounting structure and the second mounting structure, respectively, to electrical components to which the articulated direct-mount inductor directly interfaces.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 6 shows a flowchart of a method for configuring an impedance matching system, in accordance with some embodiments of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
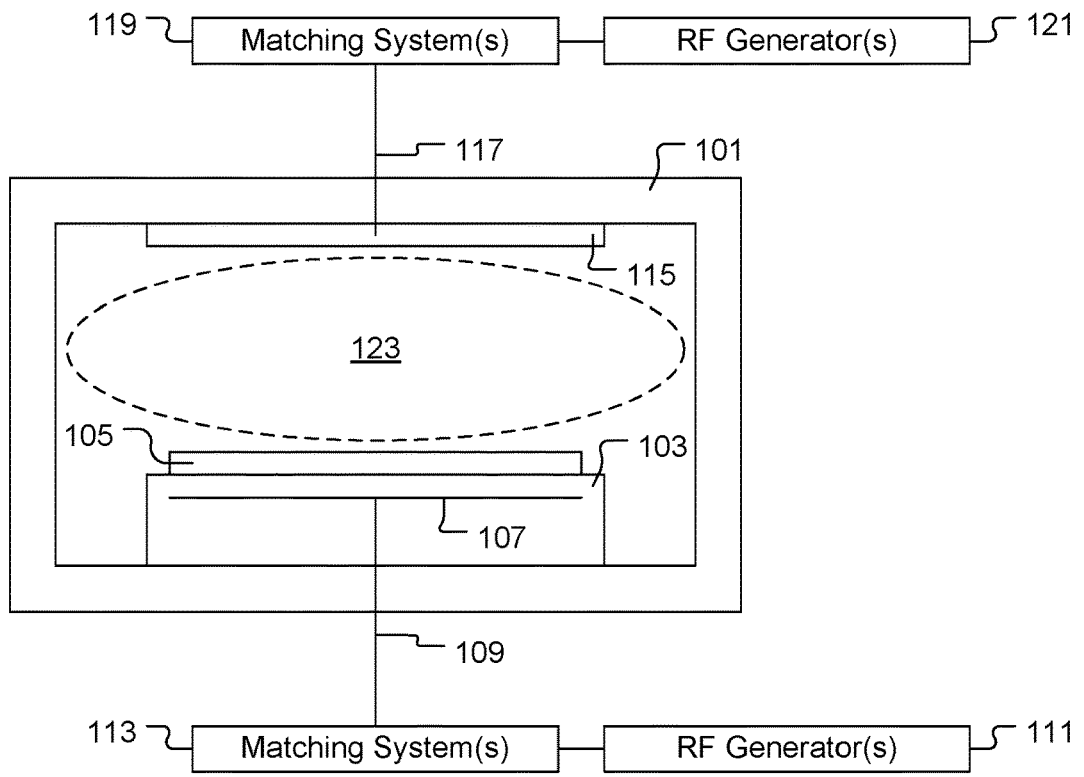
FIG. 1A shows an example vertical cross-section diagram of a CCP processing chamber, in accordance with some embodiments of the present invention.

In the semiconductor industry, semiconductor substrates can undergo fabrication operations in various types of plasma chambers, such as capacitively coupled plasma (CCP) processing chamber and inductively coupled plasma (ICP) plasma processing chambers. FIG. 1A shows an example vertical cross-section diagram of a CCP processing chamber 101, in accordance with some embodiments of the present invention. The CCP processing chamber 101 defines a processing volume within which a plasma 123 is generated in exposure to a substrate 105 to affect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material 105 present on the substrate 105.

In some embodiments, the substrate 105 is a semiconductor wafer undergoing a fabrication procedure. However, it should be understood that in various embodiments, the substrate 105 can be essentially any type of substrate that is subjected to a plasma-based fabrication process. For example, in some embodiments, the term substrate 105 as used herein can refer to substrates formed of sapphire, GaN, GaAs or SiC, or other substrate materials, and can include glass panels/substrates, metal foils, metal sheets, polymer materials, or the like. Also, in various embodiments, the substrate 105 as referred to herein may vary in form, shape, and/or size. For example, in some embodiments, the substrate 105 referred to herein may correspond to a 200 mm (millimeters) semiconductor wafer, a 300 mm semiconductor wafer, or a 450 mm semiconductor wafer. Also, in some embodiments, the substrate 105 referred to herein may correspond to a non-circular substrate, such as a rectangular substrate for a flat panel display, or the like, among other shapes.

In various embodiments, the CCP processing chamber 101 operates by flowing one or more process gases into the processing volume, and by applying radiofrequency power to the one or more process gases to transform the one or more process gases into the plasma 123 in exposure to the substrate 105, in order to affect a change in material or surface condition on the substrate 105. The CCP processing chamber 101 includes a substrate support structure 103 upon which the substrate 105 is positioned and supported during processing operations. In some embodiments, an electrode 107 is disposed within the substrate support structure 103 to provide for transmission of radiofrequency power from the electrode 107 through the processing volume to generate the plasma 123. The electrode 107 is connected to receive radiofrequency power through a radiofrequency power supply structure 109, which is connected to one or more radiofrequency signal generator(s) 111 by way of one or more impedance matching system(s) 113. The matching system(s) 113 include an arrangement of capacitors and inductors configured to ensure that an impedance seen by the radiofrequency signal generator(s) 111 at the radiofrequency power supply structure 109 is sufficiently close to a load impedance for which the radiofrequency signal generator(s) 111 is designed to operate, so that radiofrequency signals generated and transmitted by the radiofrequency signal generator(s) 111 will be transmitted into the processing volume in an efficient manner, i.e., without unacceptable reflection.

Also, in some embodiments, an upper electrode 115 can also be provided. In various embodiments, the upper electrode 115 can provide either an electrical ground electrode or can be used to transmit radiofrequency power into the processing volume. In some embodiments, the upper electrode 115 is connected to receive radiofrequency power through a radiofrequency power supply structure 117, which is connected to one or more radiofrequency signal generator(s) 121 by way of one or more impedance matching system(s) 119. The matching system(s) 119 include an arrangement of capacitors and inductors configured to ensure that an impedance seen by the radiofrequency signal generator(s) 121 at the radiofrequency power supply structure 117 is sufficiently close to a load impedance for which the radiofrequency signal generator(s) 121 is designed to operate, so that radiofrequency signals generated and transmitted by the radiofrequency signal generator(s) 121 will be transmitted into the processing volume in an efficient manner, i.e., without unacceptable reflection.

Figure 1B:
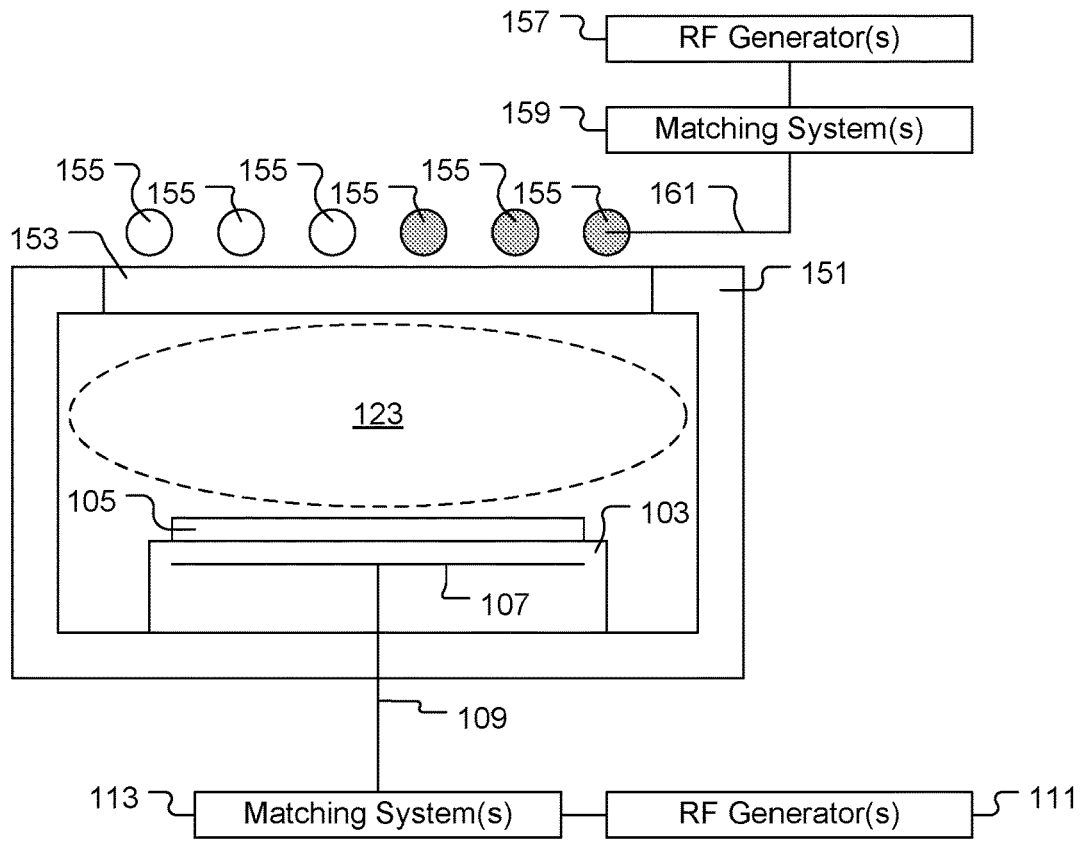
FIG. 1B shows an example vertical cross-section diagram of an ICP processing chamber, in accordance with some embodiments of the present invention.

FIG. 1B shows an example vertical cross-section diagram of an ICP processing chamber 151, in accordance with some embodiments of the present invention. The ICP processing chamber can also be referred to as a transformer coupled plasma (TCP) processing chamber. For ease of discussion herein, ICP processing chamber will be used to refer to both ICP and TCP processing chambers. The ICP processing chamber 151 defines a processing volume within which the plasma 123 is generated in exposure to the substrate 105 to affect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material present on the substrate 105.

It should be understood that the ICP processing chamber 150 can be any type of ICP processing chamber in which radiofrequency signals are transmitted from a coil 155 disposed outside the ICP processing chamber 151 to a process gas within the ICP processing chamber 151 to generate the plasma 123 within the ICP processing chamber 151. An upper window structure 153 is provided to allow for transmission of radiofrequency signals from the coil 155 through the upper window structure 153 and into the processing volume of the ICP processing chamber 151. The ICP processing chamber 150 operates by flowing one or more process gases into the processing volume, and by applying radiofrequency power from the coil 155 to the one or more process gases to transform the one or more process gases into the plasma 123 in exposure to the substrate 105, in order to affect a change in material or surface condition on the substrate 105. The coil 155 is disposed above the upper window structure 153. In the example of FIG. 1B, the coil 155 is formed as a radial coil assembly, with the shaded parts of the coil 155 turning into the page of the drawing and with the unshaded parts of the coil 155 turning out of the page of the drawing. It should be understood, however, that in other embodiments the coil 155 can be of essentially any configuration that is suitable for transmitting radiofrequency power through the upper window structure 153 and into the plasma processing volume. In various embodiments, the coil 155 can have any number of turns and any cross-section size and shape (circular, oval, rectangular, trapezoidal, etc.) as required to provide the necessary transmission of radiofrequency signals through the upper window structure 153 into the processing volume.

The coil 155 is connected through a radiofrequency power supply structure 161 to one or more radiofrequency signal generator(s) 157 by way of one or more matching system(s) 159. The matching system(s) 159 includes an arrangement of capacitors and/or inductors configured to ensure that an impedance seen by the radiofrequency signal generator(s) 157 at the coil 155 is sufficiently close to a load impedance for which the radiofrequency signal generator(s) 157 is designed to operate, so that radiofrequency signals supplied to the coil 155 by the primary radiofrequency signal generator(s) 157 will be transmitted into the processing volume in an efficient manner, i.e., without unacceptable reflection. Also, in some embodiments, the ICP processing chamber 151 can include the electrode 107, the radiofrequency power supply structure 109, the matching system(s) 113, and the radiofrequency signal generator(s) 111, as previously described with regard to FIG. 1A.

Figure 1C:
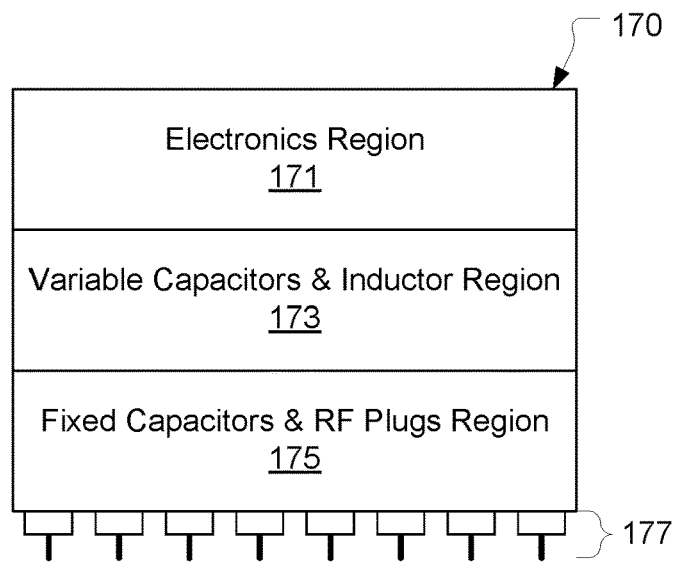
FIG. 1C shows a configuration of an example impedance matching system, in accordance with some embodiments of the present invention.

FIG. 1C shows a configuration of an example impedance matching system 170, in accordance with some embodiments of the present invention. The example impedance matching system 170 can be used for any of the matching systems 119, 113, 159 shown in FIGS. 1A and 1B. The impedance matching system 170 includes an electronics region 171 that includes control boards, cables, and server motors for controlling settings of variable capacitors. The impedance matching system 170 also includes a variable capacitors/inductor region 173 that includes a number of variable capacitors positioned and connected to be controlled by the sever motors within the electronics region 171. The variable capacitors/inductor region 173 also includes at least one inductor connected to electrical components, such as to a number of the variable capacitors. The variable capacitors/inductor region 173 can also include a number of voltage-current (VI) sensors and corresponding connection structures. The impedance matching system 170 includes a fixed capacitors/radiofrequency plugs region 175 that includes a number of fixed capacitors and a number of radiofrequency plugs 177 configured to provide for electrical connection to the chamber coil(s) and/or electrode(s).

It should be understood that the various components disposed within the example impedance matching system 170 are connected to form an impedance matching circuit that functions to substantially match an impedance of the load, i.e., of the plasma 123, to an impedance of the radiofrequency signal source, i.e., to the impedance of the radiofrequency signal generator(s) 121, 111, 157, so that radiofrequency power will be efficiently transferred to the load. It should be understood that the configuration of the example impedance matching system 170 discussed above is provided to facilitate description of the present invention and is not intended to be limiting. In other embodiments, the invention disclosed herein can be used with essentially any impedance matching system configuration.

Figure 1D:
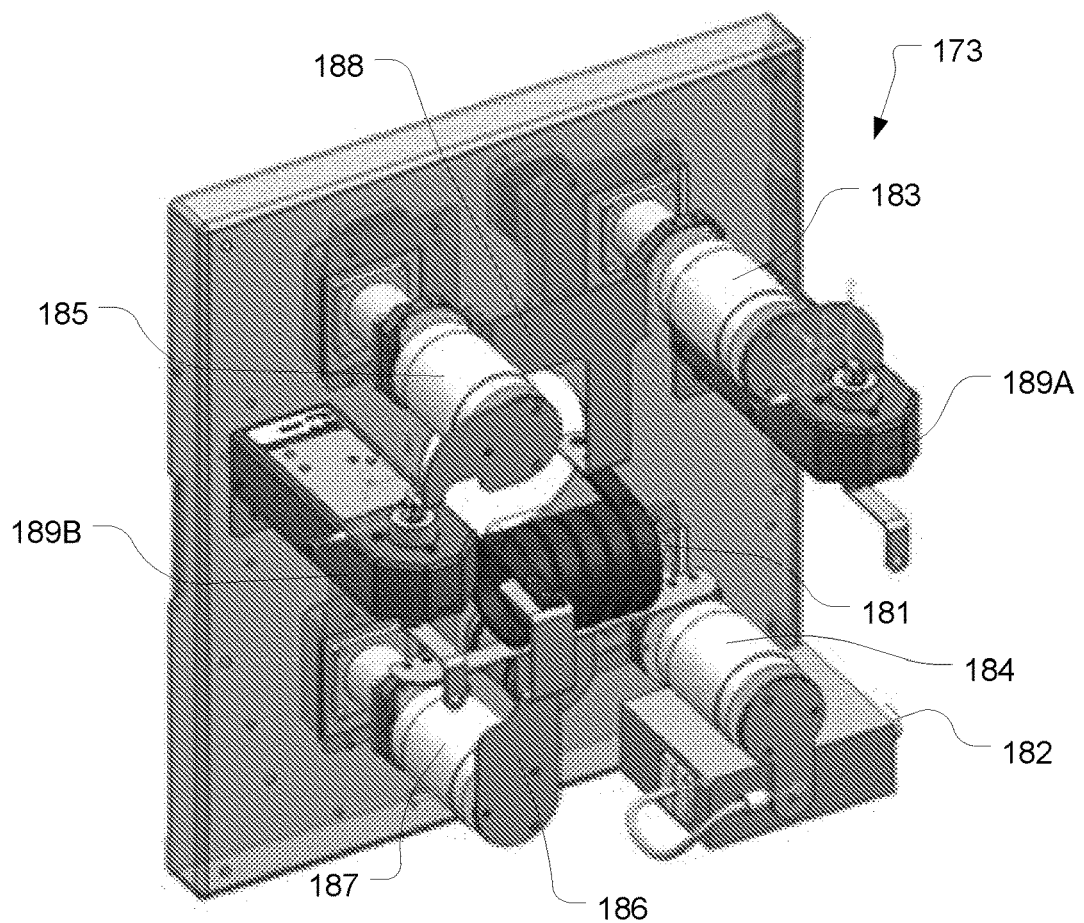
FIG. 1D shows an example configuration of the variable capacitors and inductor region, including a radiofrequency signal supply input terminal.
Figure 1E:
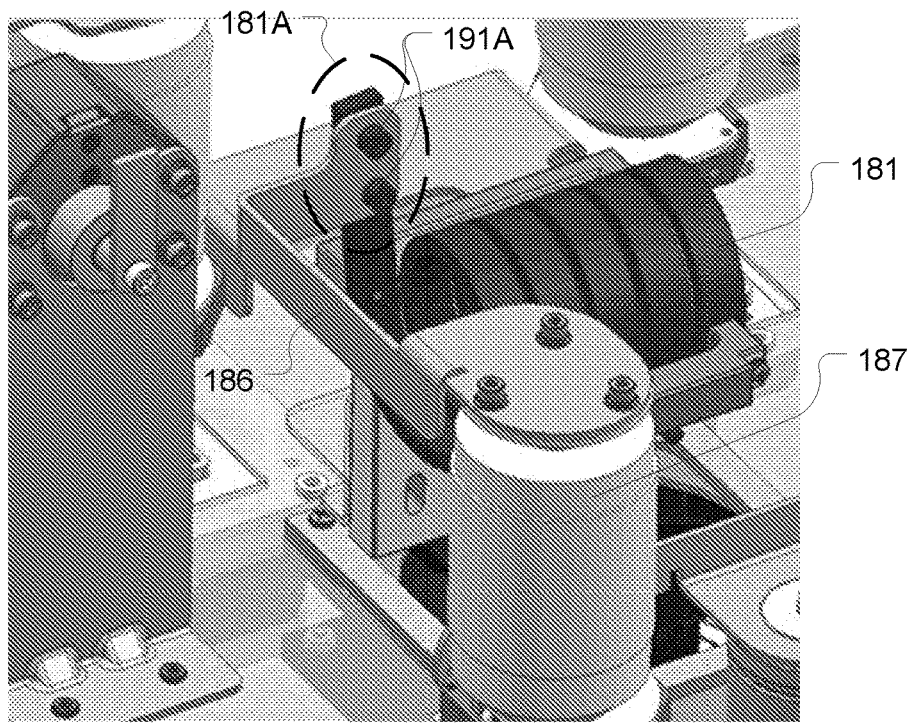
FIG. 1E shows a closer view of the mechanical/electrical connection between the second terminal of the variable capacitor and a first connection region at the first end of the conventional inductor, through the connection strap.

FIG. 1D shows an example configuration of the variable capacitors/inductor region 173, including a radiofrequency signal supply input terminal 182. Also, in this example, the variable capacitors/inductor region 173 includes multiple VI sensors 189A, 189B. And, in this example, the incoming radiofrequency signal(s) are transmitted to a first terminal of a variable capacitor 184. A second terminal of the variable capacitor 184 is connected to a first terminal of a variable capacitor 187. A second terminal of the variable capacitor 187 is connected to a first end of a conventional inductor 181, through a connection strap 186. FIG. 1E shows a closer view of the mechanical/electrical connection between the second terminal of the variable capacitor 187 and a first connection region 181A at the first end of the conventional inductor 181, through the connection strap 186. The first connection region 181A of the conventional inductor 181 includes a pair of holes to accommodate fasteners 191A for securing the conventional inductor 181 to the connection strap 186.

Figure 1F:
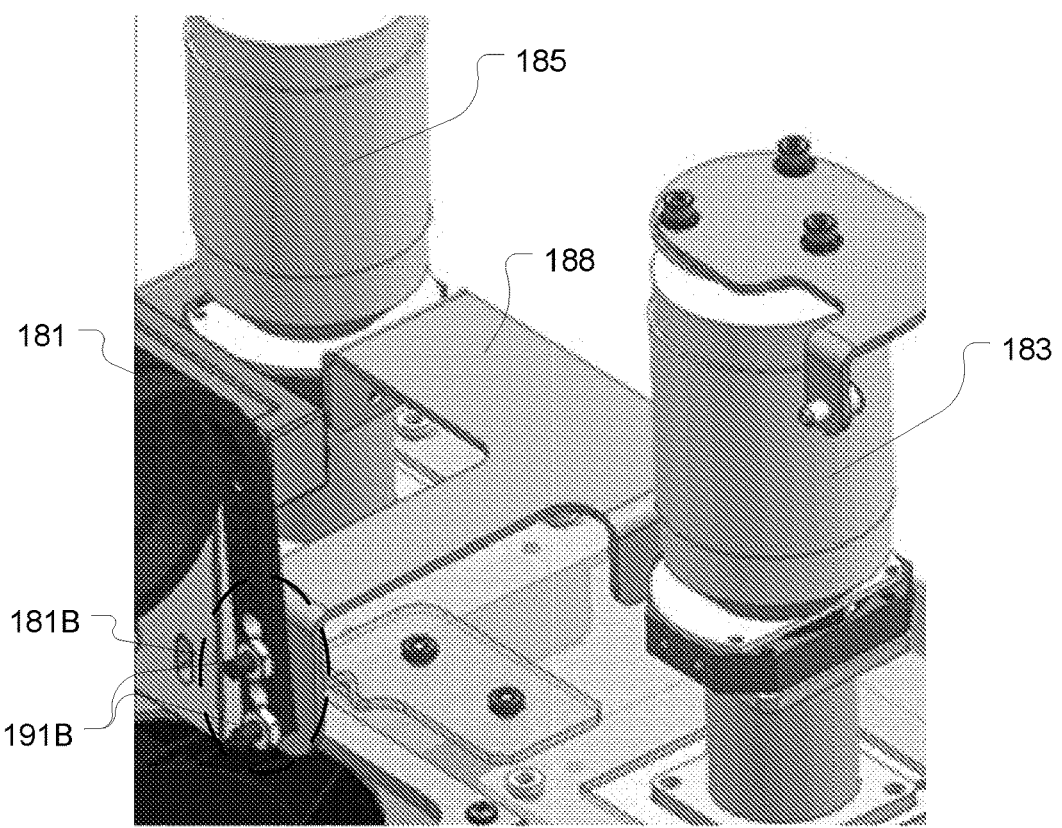
FIG. 1F shows a closer view of the mechanical/electrical connection between a second connection region of the conventional inductor and each of the first terminal of the variable capacitor and the first terminal of the variable capacitor, through the connection strap.

FIG. 1D also shows a second terminal of the conventional inductor 181 connected to both a first terminal of a variable capacitor 183 and a first terminal of a variable capacitor 185, through a connection strap 188. FIG. 1F shows a closer view of the mechanical/electrical connection between a second connection region 181B of the conventional inductor 181 and each of the first terminal of the variable capacitor 183 and the first terminal of the variable capacitor 185, through the connection strap 188. The second connection region 181B of the conventional inductor 181 includes a pair of holes to accommodate fasteners 191B for securing the conventional inductor 181 to the connection strap 188.

Figure 1G:
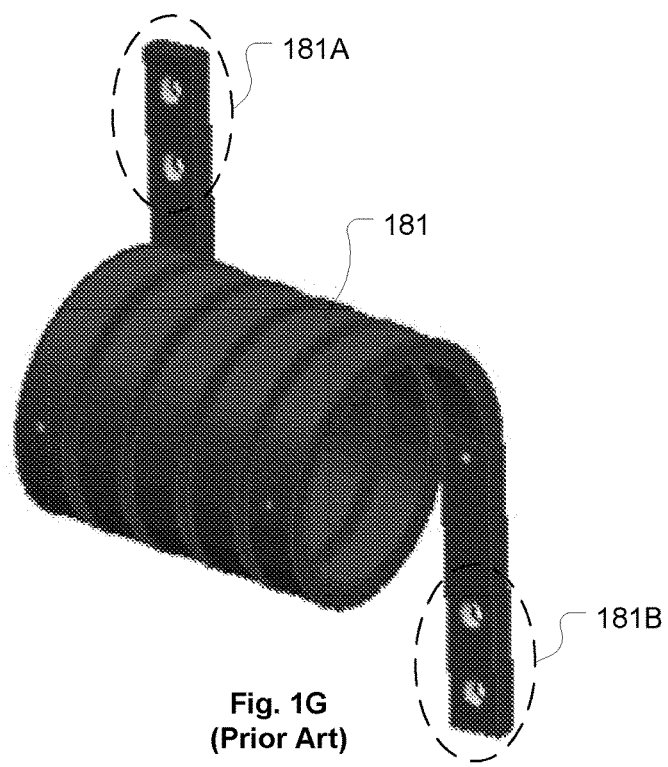
FIG. 1G shows an isometric view of the conventional inductor.
Figure 1H:
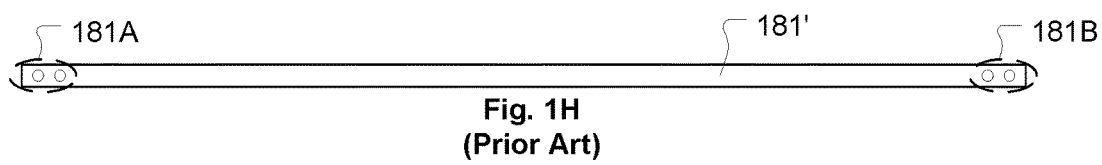
FIG. 1H shows a configuration of the substantially rectangular-shaped electrically conductive material prior to it being wound into the coil to form the conventional inductor.
Figure 1I:
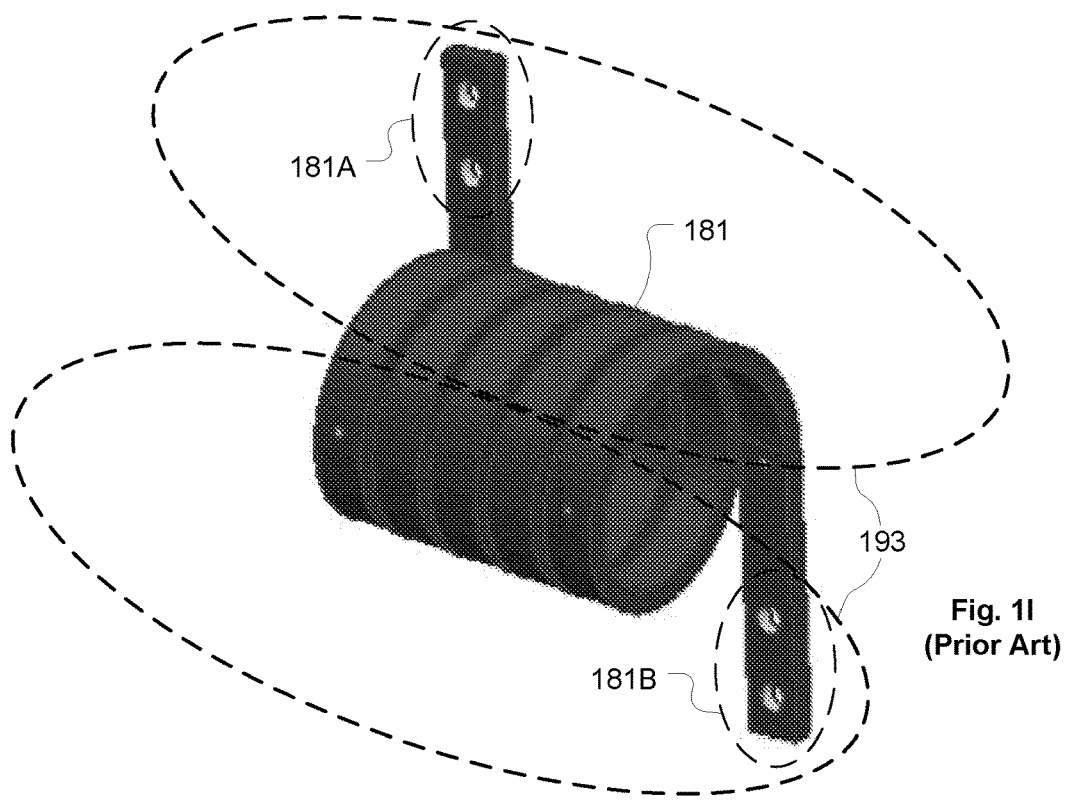
FIG. 1I shows the conventional inductor with lines depicting the strong electromagnetic field generated by transmission of radiofrequency signal(s) through the conventional inductor.

It should be understood that the variable capacitors/inductor region 173 can include more or less components than those discussed above. However, attention is drawn to the configuration of the conventional inductor 181 and the connection straps 186 and 188 used to connect the conventional inductor 181 to the variable capacitors 187, 183, and 185. FIG. 1G shows an isometric view of the conventional inductor 181. The conventional inductor 181 is formed as a simple coil of electrically conductive material. For instance, FIG. 1H shows a configuration of electrically conductive material 181' prior to it being wound into the coil to form the conventional inductor 181. FIG. 1I shows the conventional inductor 181 with lines 193 depicting the strong electromagnetic field generated by transmission of radiofrequency signal(s) through the conventional inductor 181. As shown in FIG. 1I, the first connection region 181A and the second connection region 181B of the conventional inductor 181 are positioned within the strong electromagnetic field emanating from the conventional inductor 181.

The strong electromagnetic field emanating from the conventional inductor 181 causes heating of the fasteners 191A within the first connection region 181A of the conventional inductor 181 and heating of the fasteners 191B within the second connection region 181B of the conventional inductor 181. The fasteners 191A, 191B used to secure the conventional inductor 181 to the connection straps 186 and 188 are formed of a material that is chemically and mechanically compatible with both the conventional inductor 181 and the connection straps 186 and 188. In some cases, the fasteners 191A, 191B are formed of the same material as the conventional inductor 181, e.g., copper, aluminum, etc., so as to match the coefficient of thermal expansion between the fasteners 191A, 191B and the conventional inductor 181. Otherwise, the fasteners 191A, 191B will be susceptible to mechanical failure as the conventional inductor 181 heats up and expands dimensionally. Similarly, in some cases, the connection straps 186 and 188 are also formed of the same material as the fasteners 191A, 191B and as the conventional inductor 181 to avoid incompatible coefficients of thermal expansion.

By way of example, in some embodiments, based on a 97% efficiency, about 200 Watts (W) may be dissipated in the variable capacitors/inductor region 173 of the example impedance matching system 170. And, a majority of this power will be dissipated from the conventional inductor 181. In some embodiments, a fan is installed to provide forced air cooling through the impedance matching system 170, and especially through the variable capacitors/inductor region 173. However, the forced air cooling is not capable of removing the excess heat from within the variable capacitors/inductor region 173. During operation, the conventional inductor 181 can reach temperatures up to 300° C., making the conventional inductor 181 glow red hot, and even anneal in some cases. Even with maximum cooling effort, the excessively high temperature of the conventional inductor 181 cannot be sufficiently reduced. In an effort to reduce the operating temperature of the conventional inductor 181, a lower inductance version of the conventional inductor 181 can be tried. However, the lower inductance version of the conventional inductor 181 in combination with maximum forced air cooling may only reduce the temperature of the conventional inductor 181 to about 150° C., with is still too high.

Infrared analysis of the operating impedance matching system 170 indicates that the fasteners 191A, 191B are being excessively heated by their exposure to the strong electromagnetic field emanating from the conventional inductor 181. Prior to the present invention, it was an industry standard practice to specify the conventional inductor 181 as an individual component formed as a simple coil of electrically conductive material, in combination with specification of separate connection straps 186 and 188 for making the electrical/mechanical connections between the conventional inductor 181 and other components within the impedance matching system 170. Also, prior to the present invention, the available industry standard conventional inductors 181 had their first connection region 181A and second connection region 181B located proximate to the coiled region (such as shown in FIG. 1G) such that changing from one conventional inductor 181 to another would not cure the overheating issue caused by the fasteners 191A, 191B being located within and subjected to the high electromagnetic field emanating from the conventional inductor 181 during operation. Because of the conventional inductor 181 being an off-the-shelf spec component, and because of an aversion to modifying the configuration of other components within the impedance matching system 170, prior attempts at managing the excessive heating issue within the impedance matching system 170 focused on cooling methods. However, the cooling methods were determined to be insufficient for lowering the temperature of the fasteners 191A, 191B and surrounding components affected by conductive and/or convective heat transfer from the overheated fasteners 191A, 191B.

Figure 2A:
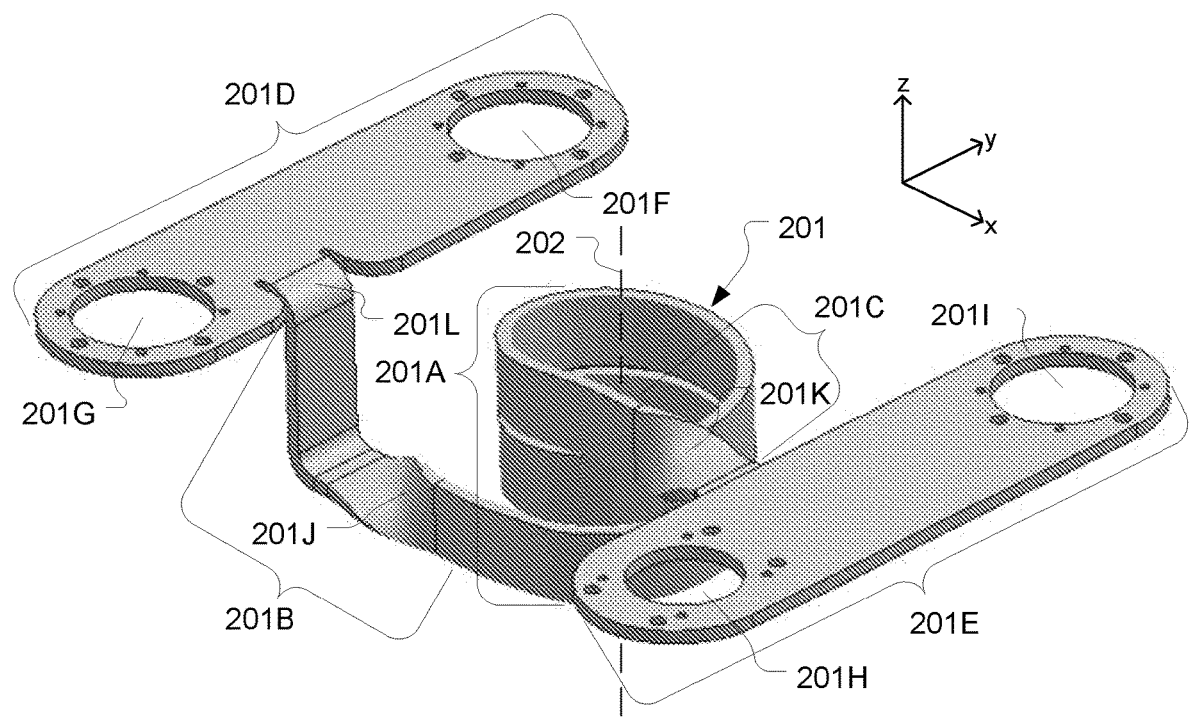
FIG. 2A shows an isometric view of an articulated direct-mount inductor configured to resolve the overheating issues associated with fasteners located within the high electromagnetic field, in accordance with some embodiments of the present invention.

FIG. 2A shows an isometric view of an articulated direct-mount inductor 201 configured to resolve the overheating issues associated with fasteners located within the high electromagnetic field, in accordance with some embodiments of the present invention. The articulated direct-mount inductor 201 is configured to directly mount to interfacing components without the use of separate connection straps, e.g., connection straps 186 and 188, and without the use of fasteners disposed within the high electromagnetic field emanating from the inductor 201, e.g., fasteners 191A and 191B. The articulated direct-mount inductor 201 can also be referred to as a fastener-free inductor 201, since there are no fasteners disposed within the high electromagnetic field emanating from the inductor 201. The articulated direct-mount inductor 201 is formed of electrically conductive material. In various embodiments, the articulated direct-mount inductor 201 is formed of either copper, aluminum, electrically conductive alloy, or combination thereof, or of another type of electrically conductive material.

The example articulated direct-mount inductor 201 of FIG. 2A includes a coil portion 201A, a first articulation portion 201B, a second articulation portion 201C, a first mounting structure 201D, and a second mounting structure 201E. The first mounting structure 201D includes a first mounting region 201G and a second mounting region 201F. Similarly, the second mounting structure 201E includes a first mounting region 201H and a second mounting region 201I. Each of the mounting regions 201G, 201F, 201H, and 201I is configured to mount in physical and electrical contact with a terminal of a respective electrical component, such as a variable capacitor. It should be understood that while the example articulated direct-mount inductor 201 includes four mounting regions 201G, 201F, 201H, and 201I for connection to four electrical components, in other embodiments, the articulated direct-mount inductor 201 can be configured to connect to two or more electrical components, with the first mounting structure 201D including at least one mounting region and with the second mounting structure 201E including at least one mounting region. Also, it should be understood that in various embodiments, the first mounting structure 201D can include any number of mounting regions to accommodate physical and electrical connection to any corresponding number of electrical components. And, similarly, in various embodiments, the second mounting structure 201E can include any number of mounting regions to accommodate physical and electrical connection to any corresponding number of electrical components.

In the example of FIG. 2A, the articulated direct-mount inductor 201 includes a pivot section 201J configured to translate an orientation of the first mounting structure 201D relative to an orientation of a centerline 202 of the coil portion 201A. More specifically, the pivot section 201J in combination with a bend 201L orients the first mounting structure 201D in the x-y plane, with the centerline 202 of the coil portion 201A oriented in the z-direction. It should be understood that in various embodiments, the pivot section 201J can be configured to position the first mounting structure 201D in essentially any desired orientation relative to the centerline 202 of the coil portion 201A. Similarly, the articulated direct-mount inductor 201 includes a pivot section 201K configured to translate an orientation of the second mounting structure 201E into the x-y plane, with the centerline 202 of the coil portion 201A oriented in the z-direction. It should be understood that in various embodiments, the pivot section 201K can be configured to position the second mounting structure 201E in essentially any desired orientation relative to the centerline 202 of the coil portion 201A. In some embodiments, the first mounting structure 201D and the second mounting structure 201E are oriented to accommodate a required position and/or orientation of the electrical components to which they will connect, respectively, while the centerline 202 of the coil portion 201A is simultaneously oriented to provide for optimum cooling of the articulated direct-mount inductor 201. For example, in some embodiments, the centerline 202 of the coil portion 201A can be oriented in a predominate direction of cooling air flow to maximize an amount of cooling air flow through the coil portion 201A, while the first mounting structure 201D and the second mounting structure 201E are simultaneously oriented to accommodate a required position and/or orientation of the electrical components to which they will respectively connect. Also, in some embodiments, the articulated direct-mount inductor 201 is formed to have the pivot sections 201J and 201K positioned sufficiently far away from the centerline 202 of the coil portion 201A to ensure that geometric variation in the pivot sections 201J and 201K relative to the coil portion 201A does not cause an adverse perturbation in the inductance generated by the coil portion 201A. In some embodiments, the articulated direct-mount inductor 201 is formed to have the pivot sections 201J and 201K positioned outside of a strong electromagnetic field emanating from the coil portion 201A.

Figure 2B:
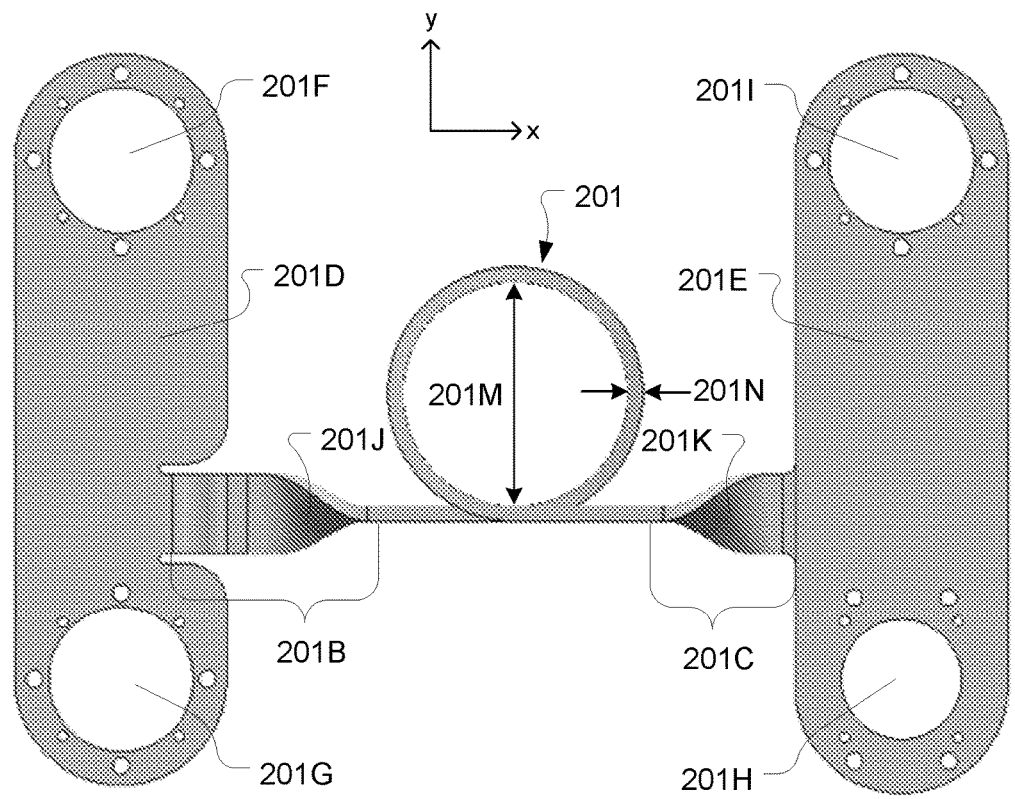
FIG. 2B shows a top view of the articulated direct-mount inductor, in accordance with some embodiments of the present invention.
Figure 2C:
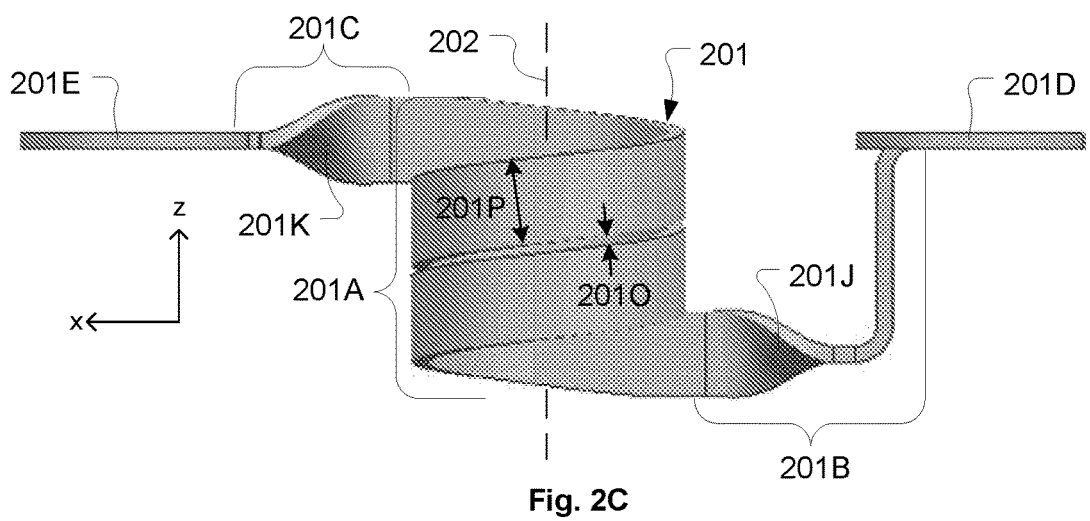
FIG. 2C shows a side view of the articulated direct-mount inductor, in accordance with some embodiments of the present invention.

FIG. 2B shows a top view of the articulated direct-mount inductor 201, in accordance with some embodiments of the present invention. FIG. 2C shows a side view of the articulated direct-mount inductor 201, in accordance with some embodiments of the present invention. The coil portion 201A of the articulated direct-mount inductor 201 includes a number of turns of electrically conductive material about a core region having a diameter 201M. In some embodiments, the diameter 201M of the core region of the coil portion 201A is within a range extending from about 0.5 inch to about 20 inches. In some embodiments, the diameter 201M of the core region of the coil portion 201A is within a range extending from about 0.5 inch to about 10 inches. In some embodiments, the diameter 201M of the core region of the coil portion 201A is within a range extending from about 1 inch to about 5 inches. In some embodiments, the diameter 201M of the core region of the coil portion 201A is about 2.5 inches.

In some embodiments, the core region of the coil portion 201A is empty, i.e., is an air core region. However, in other embodiments, the core region of the coil portion 201A can be occupied by a material suited for the intended operation of the articulated direct-mount inductor 201. For example, in some embodiments, the core region of the coil portion 201A can be occupied by a ceramic material or a polymer material, among other materials. In some embodiments, the electrically conductive material that forms the coil portion 201A has a rectangular cross-section defined by a thickness 201N and a width 201P. In some embodiments, the thickness 201N of the electrically conductive material that forms the coil portion 201A is within a range extending from about 0.032 inch to about 0.25 inch. In some embodiments, the thickness 201N of the electrically conductive material that forms the coil portion 201A is within a range extending from about 0.064 inch to about 0.25 inch. In some embodiments, the thickness 201N of the electrically conductive material that forms the coil portion 201A is within a range extending from about 0.125 inch to about 0.25 inch. In some embodiments, the thickness 201N of the electrically conductive material that forms the coil portion 201A is about 0.25 inch. In some embodiments, the width 201P of the electrically conductive material that forms the coil portion 201A is within a range extending from about 0.125 inch to about 1.5 inches. In some embodiments, the width 201P of the electrically conductive material that forms the coil portion 201A is within a range extending from about 0.25 inch to about 1 inch. In some embodiments, the width 201P of the electrically conductive material that forms the coil portion 201A is within a range extending from about 0.5 inch to about 0.75 inch. In some embodiments, the width 201P of the electrically conductive material that forms the coil portion 201A is about 0.5 inch.

Also, in some embodiments, adjacent turns of the electrically conductive material that forms the coil portion 201A are separated from each other by a distance 201O, as measured perpendicularly between facing side surfaces of the adjacent turns. In some embodiments, the distance 201O between adjacent turns of the electrically conductive material that forms the coil portion 201A is within a range extending from about 0.125 inch to about 1 inch. In some embodiments, the distance 201O between adjacent turns of the electrically conductive material that forms the coil portion 201A is within a range extending from about 0.125 inch to about 0.5 inch. In some embodiments, the distance 201O between adjacent turns of the electrically conductive material that forms the coil portion 201A is within a range extending from about 0.125 inch to about 0.25 inch. In some embodiments, the distance 201O between adjacent turns of the electrically conductive material that forms the coil portion 201A is about 0.125 inch.

In the example of FIGS. 2A-2C, the coil portion 201A includes two complete turns about the core region having the diameter 201M. However, it should be understood that in other embodiments, the coil portion 201A can include any number of turns and/or partial turns as needed to achieve a desired inductance value for a given frequency and power of radiofrequency signal(s) to be transmitted through the articulated direct-mount inductor 201. In some embodiments, the number of turns of the coil portion 201A is within a range extending from 1 to 10. In some embodiments, the number of turns of the coil portion 201A is within a range extending from 1 to 7. In some embodiments, the number of turns of the coil portion 201A is within a range extending from 1 to 5. In some embodiments, the number of turns of the coil portion 201A is 3.

Also, in various embodiments, the diameter 201M, the thickness 201N, the width 201P, and the turn-to-turn spacing 201O can be defined as needed to achieve a desired inductance value for a given frequency and power of radiofrequency signal(s) to be transmitted through the articulated direct-mount inductor 201, while also satisfying any spatial installation requirements that may exist. Additionally, while the example articulated direct-mount inductor 201 of FIGS. 2A-2C has the coil portion 201A formed of the electrically conductive material of rectangular cross-section, it should be understood that in other embodiments the coil portion 201A can be formed of electrically conductive material of non-rectangular cross-section, such as of circular cross-section, oval cross-section, and/or other polygonal cross-section, among others.

Figure 3A:
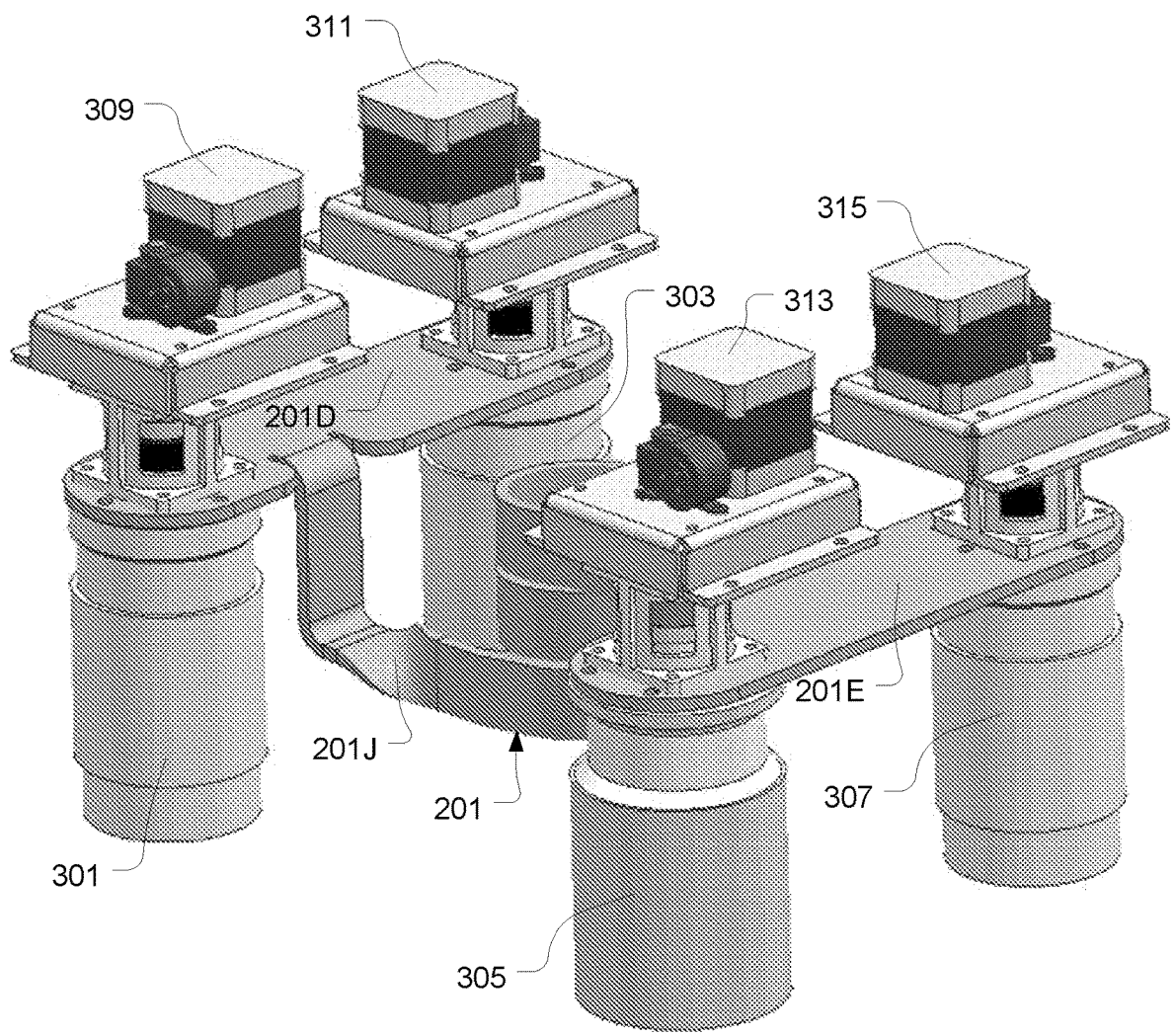
FIG. 3A shows the example articulated direct-mount inductor of FIG. 2A connected to four variable capacitors, in accordance with some embodiments of the present invention.
Figure 3B:
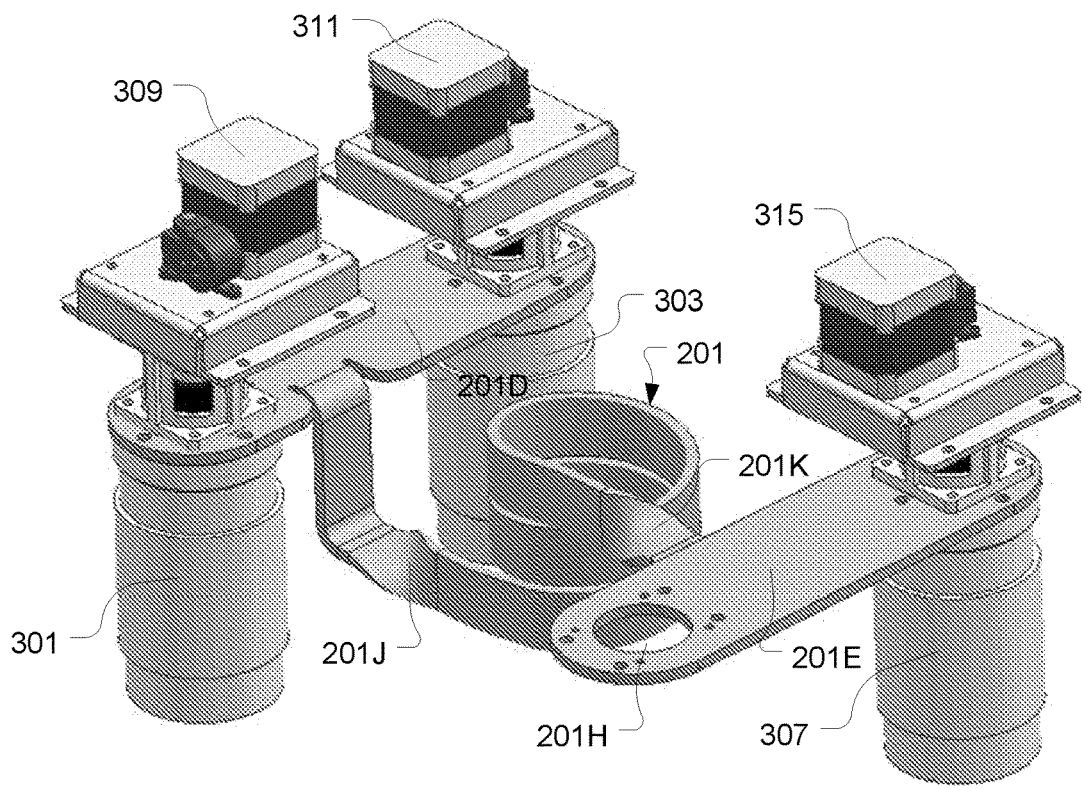
FIG. 3B shows the configuration of FIG. 3A with the variable capacitor and corresponding control motor and associated mechanical linkage removed to reveal the mounting region, in accordance with some embodiments of the present invention.

FIG. 3A shows the example articulated direct-mount inductor 201 of FIG. 2A connected to four variable capacitors 301, 303, 305, and 307, in accordance with some embodiments of the present invention. Each of the four variable capacitors 301, 303, 305, and 307 is connected through mechanical linkage to a respective control motor 309, 111, 313, and 315. It should be understood that the four mounting regions 201G, 201F, 201H, and 201I are configured to accommodate pass-through of the mechanical linkage from the control motors 309, 111, 313, 315 to the variable capacitors 301, 303, 305, 307, respectively. With reference back to FIG. 1C, in some impedance matching system embodiments, the control motors 309, 111, 313, 315 and corresponding portions of the mechanical linkage are disposed within the electronics region 171, and the variable capacitors 301, 303, 305, 307 and corresponding portion of the mechanical linkage are disposed within the variable capacitors/inductor region 173 along with the articulated direct-mount inductor 201. FIG. 3B shows the configuration of FIG. 3A with the variable capacitor 305 and corresponding control motor 313 and associated mechanical linkage removed to reveal the mounting region 201H, in accordance with some embodiments of the present invention.

In some embodiments, the first and second mounting structures 201D, 201E of the articulated direct-mount inductor 201 are connected to the terminals of the variable capacitors 301, 303, 305, 307, as indicated in FIG. 3A, using fasteners such as bolts or machine screws or the like. In some embodiments, these fasteners are formed of the same material as the articulated direct-mount inductor 201 to ensure consistency in coefficients of thermal expansion to avoid shearing of the fasteners. Also, in some embodiments, the first and second mounting structures 201D, 201E of the articulated direct-mount inductor 201 are connected to the terminals of the variable capacitors 301, 303, 305, 307, as indicated in FIG. 3A, using a clamping force applied by mechanical clamping structures separate from the articulated direct-mount inductor 201. It should be understood that the fasteners and/or mechanical clamping structures used to connect the first and second mounting structures 201D, 201E of the articulated direct-mount inductor 201 to the terminals of the variable capacitors 301, 303, 305, 307 are located outside of the strong electromagnetic field emanating from the coil portion 201A during operation. Therefore, it should be understood and appreciated that these fasteners and/or mechanical clamping structures will not be subject to excessive heating induced by the strong electromagnetic field emanating from the coil portion 201A during operation.

Figure 4:
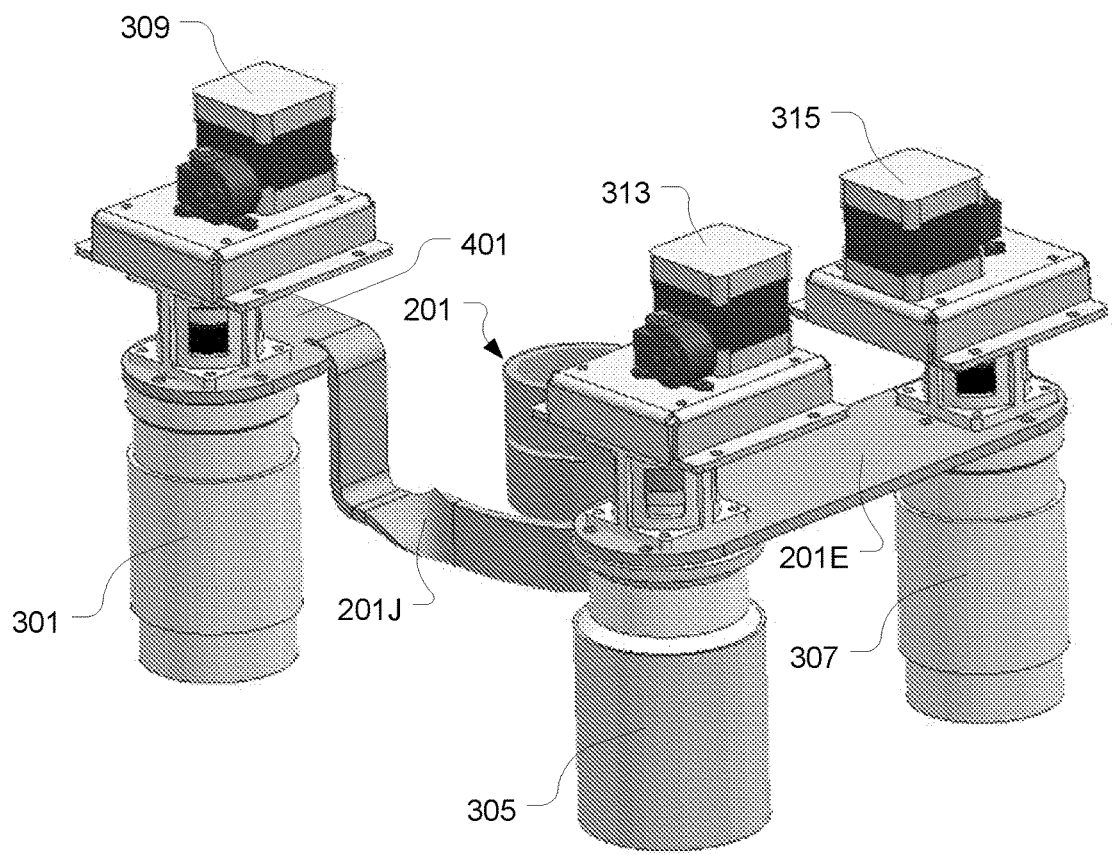
FIG. 4 shows an example of the articulated direct-mount inductor configured to connect to three variable capacitors, in accordance with some embodiments of the present invention.
Figure 5:
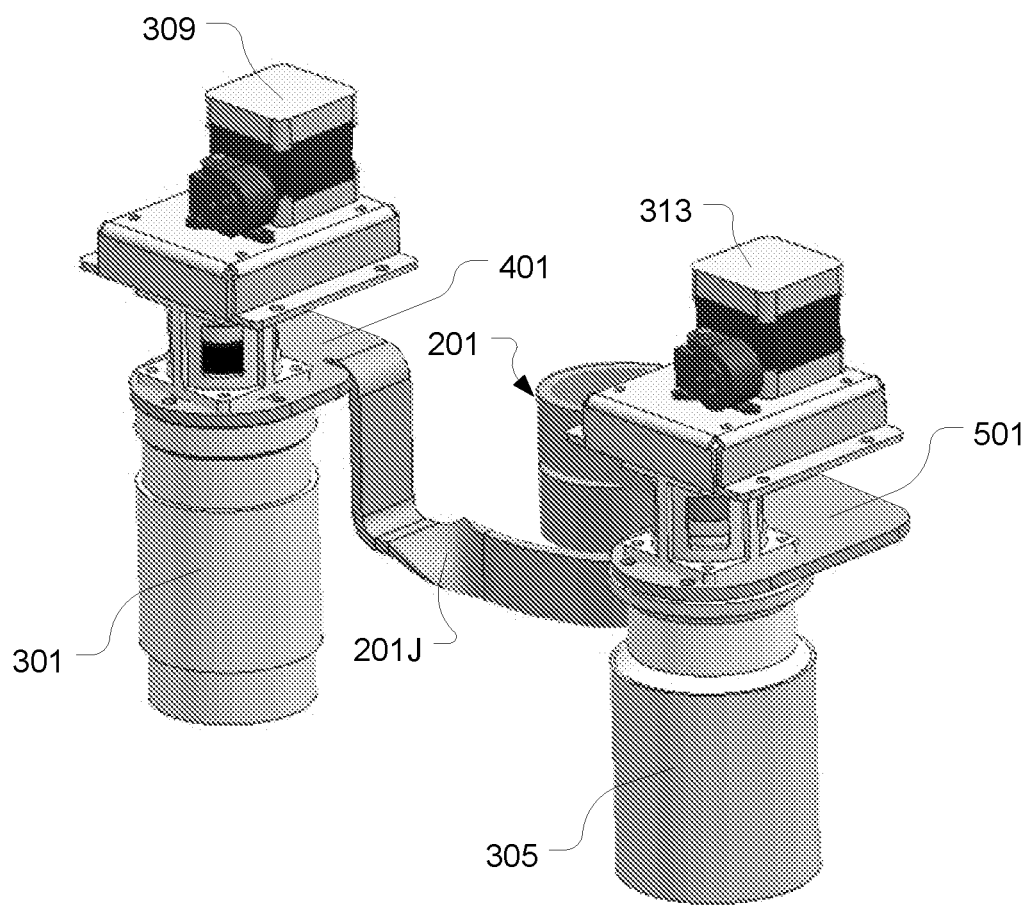
FIG. 5 shows another example of the articulated direct-mount inductor configured to connect to two variable capacitors, in accordance with some embodiments of the present invention.

As previously mentioned, in various embodiments, the articulated direct-mount inductor 201 can be configured to connect to two or more electrical components, with the first mounting structure 201D connected to at least one electrical component and with the second mounting structure 201E connected to at least one electrical component. FIG. 4 shows an example of the articulated direct-mount inductor 201 configured to connect to three variable capacitors 301, 305, and 307, in accordance with some embodiments of the present invention. In the example of FIG. 4, a mounting structure 401 replaces the first mounting structure 201D as depicted in the example of FIGS. 2A-2C. The mounting structure 401 is configured to connect to one electrical component, e.g., to the variable capacitor 301. FIG. 5 shows another example of the articulated direct-mount inductor 201 configured to connect to two variable capacitors 301 and 305, in accordance with some embodiments of the present invention. In the example of FIG. 5, the mounting structure 401 is present for connection to one electrical component, e.g., to the variable capacitor 301. Also, in the example of FIG. 5, a mounting structure 501 replaces the second mounting structure 201E as depicted in the example of FIGS. 2A-2C. The mounting structure 501 is configured to connect to one electrical component, e.g., to the variable capacitor 305.

It should be understood that the articulated direct-mount inductor 201 configurations as shown in FIGS. 2A-2C, 4, and 5 are provided by way of example to facilitate description of the present invention. In various embodiments, the articulated direct-mount inductor 201 can be configured different from what is shown in the examples of FIGS. 2A-2C, 4, and 5. For example, one or both of the first mounting structure 201D and the second mounting structure 201E can be configured to connect with three or more electrical components. Also, in some embodiments, one or both of the first mounting structure 201D and the second mounting structure 201E can be configured to include one or more bends and multiple portions that have different spatial orientations. For example, with reference back to FIG. 2A, in some embodiments, one or both of the first mounting structure 201D and the second mounting structure 201E can include a first portion oriented in the x-y plane and a second portion oriented in the x-z plane, with a bend between the first portion and the second portion. And, as another example, in some embodiments, one or both of the first mounting structure 201D and the second mounting structure 201E can include a first portion oriented in the x-y plane and a second portion oriented in the x-z plane and a third portion oriented in the y-z plane, with a first bend between the first portion and the second portion and with a second bend between the second portion and the third portion. It should be understood and appreciated that in various embodiments each of the first mounting structure 201D and the second mounting structure 201E can have essentially any spatial configuration as needed to accommodate connection to essentially any number of electrical components having essentially any spatial orientation. In this manner, the articulated direct-mount inductor 201 is a one-piece inductor configuration that can connect directly with multiple electrical components at different locations within an impedance matching system.

FIG. 6 shows a flowchart of a method for configuring an impedance matching system, in accordance with some embodiments of the present invention. The method includes an operation 601 for providing an articulated direct-mount inductor configured to directly connect to at least two electrical components at respective locations outside of a strong electromagnetic field emanating from a coil portion of the articulated direct-mount inductor during operation. In some embodiments, the at least two electrical components include one or more variable capacitors and/or one or more fixed capacitors. In addition to the coil portion, the articulated direct-mount inductor includes a first articulation portion extending from the coil portion to a first mounting portion and a second articulation portion extending from the coil portion to a second mounting structure.

The method also includes an operation 603 for connecting the articulated direct-mount inductor directly to the at least two electrical components. It should be understood that the articulated direct-mount inductor is connected to each of the at least two electrical components without use of connection straps formed separate from the articulated direct-mount inductor. Also, it should be understood that any fasteners used to connect the articulated direct-mount inductor to the at least two electrical components are located outside of the strong electromagnetic field emanating from the coil portion of the articulated direct-mount inductor during operation. In some embodiments, the operations 601 and 603 are performed such that a centerline of the coil portion of the articulated direct-mount inductor is oriented in a direction of a predominate cooling air flow path through the impedance matching system.

It should be understood that the articulated direct-mount inductor 201 can be formed using various metal fabrication processes. In some embodiments, an entirety of the articulated direct-mount inductor 201 (including the coil portion 201A, the first articulation portion 201B, the second articulation portion 201C, the first mounting structure 201D, and the second mounting structure 201E) is laid out on a planar sheet of electrically conductive material, e.g., metal. Then, the articulated direct-mount inductor 201 in its planar form is cut out of the planar sheet of electrically conductive material, such as by laser cutting and/or water jet cutting and/or drilling and/or other type of metal fabrication process. Then, the articulated direct-mount inductor 201 is transformed from its planar state into its final three-dimensional form through use of various bending processes, twisting processes, and coil wrapping processes, as needed.

Figure 7:
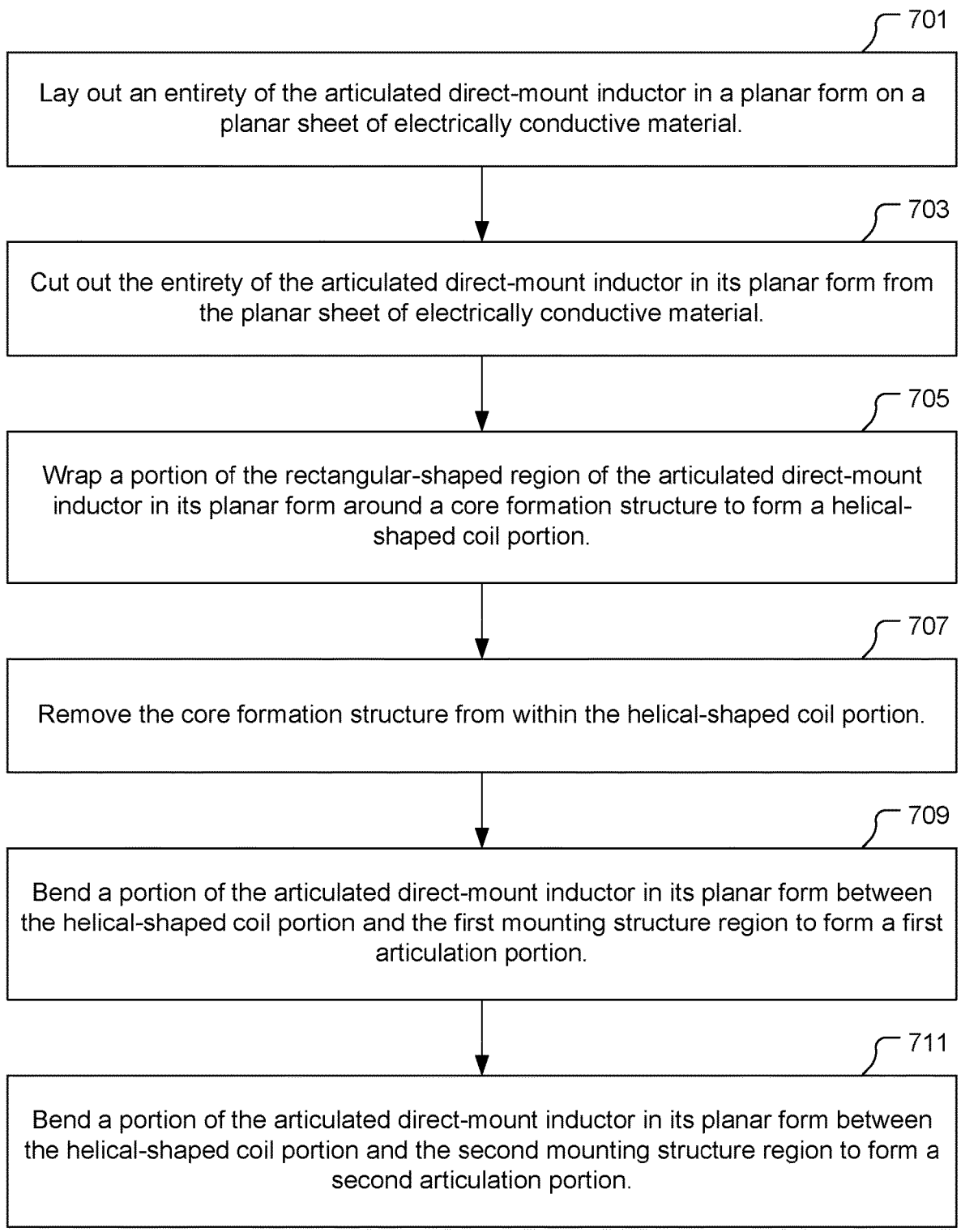
FIG. 7 shows a flowchart of a method for manufacturing an articulated direct-mount inductor, in accordance with some embodiments of the present invention.

FIG. 7 shows a flowchart of a method for manufacturing an articulated direct-mount inductor, in accordance with some embodiments of the present invention. The method includes an operation 701 for laying out an entirety of the articulated direct-mount inductor in a planar form on a planar sheet of electrically conductive material. The articulated direct-mount inductor in its planar form includes a rectangular-shaped region, and a first mounting structure region located at a first end of the rectangular-shaped region, and a second mounting structure region located at a second end of the rectangular-shaped region. The method includes an operation 703 for cutting out the entirety of the articulated direct-mount inductor in its planar form from the planar sheet of electrically conductive material. In various embodiments, the cutting of operation 703 can include one or more of laser cutting, water jet cutting, and drilling, among other fabrication techniques/processes.

The method includes an operation 705 for wrapping a portion of the rectangular-shaped region of the articulated direct-mount inductor in its planar form around a core formation structure to form a helical-shaped coil portion. In some embodiments, the core formation structure is cylindrical in shape, such that operation 705 results in transformation of the portion of the rectangular-shaped region of the articulated direct-mount inductor into a circular helical-shaped coil portion, such as the coil portion 201A shown in FIG. 2A. In other embodiments, the core formation structure can have a non-cylindrical shape. For example, in some embodiments, the core formation structure can be shaped as a rectangular parallelepiped, such that operation 705 results in transformation of the portion of the rectangular-shaped region of the articulated direct-mount inductor into a rectangular helical-shaped coil portion. It should be understood that in various embodiments, the core formation structure can have essentially any three-dimensional shape that is suitable to be wrapped by the portion of the rectangular-shaped region of the articulated direct-mount inductor in its planar form to create a helical-shaped coil portion. The method also includes an operation 707 for removing the core formation structure from within the helical-shaped coil portion.

The method also includes an operation 709 for bending a portion of the articulated direct-mount inductor in its planar form between the helical-shaped coil portion and the first mounting structure region to form a first articulation portion, such as the first articulation portion 201B shown in FIG. 2A. The method also includes an operation 711 for bending a portion of the articulated direct-mount inductor in its planar form between the helical-shaped coil portion and the second mounting structure region to form a second articulation portion, such as the second articulation portion 201C shown in FIG. 2A. The first articulation portion and the second articulation portion are formed to enable connection of the first mounting structure and the second mounting structure, respectively, to electrical components to which the articulated direct-mount inductor directly interfaces. In some embodiments, the method can also include an operation for twisting the articulated direct-mount inductor in its planar form when forming one or both of the first articulation portion and the second articulation portion to offset a centerline of the helical-shaped coil portion from one or both of the first mounting structure region and the second mounting structure region. In some embodiments, the centerline of the helical-shaped coil portion is offset in an orthogonal relationship from plane(s) within which the first mounting structure region and the second mounting structure region reside.

As discussed with regard to FIGS. 1D-1I, the conventional inductor 181 is a stock component fabricated without full consideration of its end-use installation. As such, the conventional inductor 181 requires connection straps 186, 188 and associated fasteners 191A, 191B to connect with electrical components in its end-use installation. And, the locations of the fasteners 191A, 191B within the strong electromagnetic field emanating from the conventional inductor 181 cause excessive and damaging heating of the conventional inductor 181 and interfacing components. In contrast to the conventional inductor 181, the articulated direct-mount inductor 201 disclosed herein extends in an articulated manner to connect directly with interfacing electrical components, and therefore does not require use of connection straps, e.g., connection straps 186, 188, and associated fasteners, e.g., fasteners 191A, 191B. In following, there are no fasteners located within the strong electromagnetic field emanating from the coil portion 201A of the articulated direct-mount inductor 201, and hence no excessive and damaging heating of such fasteners. Also, connection of the articulated direct-mount inductor 201 directly to its interfacing electrical components occurs outside of the strong electromagnetic field emanating from the coil portion 201A of the articulated direct-mount inductor 201. Therefore, any fasteners used to connect the articulated direct-mount inductor 201 directly to its interfacing electrical components will be located outside of the strong electromagnetic field emanating from the coil portion 201A of the articulated direct-mount inductor 201 and will not be subject to excessive and damaging heating. In some embodiments, a temperature of the articulated direct-mount inductor 201 will be within a range extending from about 25° C. to about 150° C. during operation, which is within an acceptable temperature range for air cooled impedance matching systems. In some embodiments, a temperature of the articulated direct-mount inductor 201 will be less than 100° C. during operation, which is within an acceptable temperature range for air cooled impedance matching systems. Also, it should be appreciated that in comparison with use of the conventional inductor 181, its two associated connection straps 186, 188, and its four associated fasteners 191A, 191B, the articulated direct-mount inductor 201 reduces the number of required parts from seven to one, which reduces cost and simplifies inductor installation within the impedance matching system.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. An articulated direct-mount inductor, comprising:
   a coil portion of an electrically conductive material;
   a first articulation portion of the electrically conductive material extending from the coil portion, wherein the first articulation portion includes a twist of the electrically conductive material of about ninety degrees, a first bend of the electrically conductive material of about ninety degrees in a first direction, and a second bend of the electrically conductive material of about ninety degrees in a second direction that is opposite of the first direction;
   a first mounting structure of the electrically conductive material extending from the first articulation portion, the first mounting structure including a first mounting region having a first mounting surface configured to mount in physical and electrical contact with a terminal of a first electrical component, wherein the first articulation portion orients the first mounting surface of the first mounting region parallel to an x-y plane of a Cartesian coordinate system, with the centerline of the coil portion oriented parallel to a z-axis of the Cartesian coordinate system;
   a second articulation portion of the electrically conductive material extending from the coil portion, wherein the second articulation portion includes a twist of the electrically conductive material of about ninety degrees; and
   a second mounting structure of the electrically conductive material extending from the second articulation portion, the second mounting structure including a second mounting region having a second mounting surface configured to mount in physical and electrical contact with a terminal of a second electrical component, wherein the second articulation portion orients the second mounting surface of the second mounting structure parallel to the x-y plane of the Cartesian coordinate system,
   wherein each of the coil portion, the first articulation portion, the first mounting structure, the second articulation portion, and the second mounting structure is formed from one piece of the electrically conductive material.

2. The articulated direct-mount inductor as recited in claim 1, wherein the first electrical component is a first variable capacitor, and wherein the second electrical component is a second variable capacitor, wherein each of the first variable capacitor and the second variable capacitor has a substantially cylindrical shape extending between two end portions, and wherein the first mounting surface of the first mounting region is shaped to mount on an end portion of the first variable capacitor, and wherein the second mounting surface of the second mounting region is shaped to mount on an end portion of the second variable capacitor.

3. The articulated direct-mount inductor as recited in claim 1, wherein the electrically conductive material is one or more of copper, aluminum, and an electrically conductive alloy.

4. The articulated direct-mount inductor as recited in claim 1, wherein the coil portion includes a number of turns of the electrically conductive material about a core region.

5. The articulated direct-mount inductor as recited in claim 4, wherein the core region has a diameter within a range extending from about 0.5 inch to about 20 inches.

6. The articulated direct-mount inductor as recited in claim 4, wherein the core region is empty.

7. The articulated direct-mount inductor as recited in claim 4, wherein the number of turns of the coil portion is within a range extending from 1 to 10.

8. The articulated direct-mount inductor as recited in claim 1, wherein adjacent turns of the coil portion are separated from each other by a separation distance measured perpendicularly between facing side surfaces of the adjacent turns, wherein the separation distance is within a range extending from about 0.125 inch to about 1 inch.

9. The articulated direct-mount inductor as recited in claim 1, wherein the coil portion has a rectangular cross-section defined by a thickness and a width, wherein the thickness is within a range extending from about 0.032 inch to about 0.25 inch, and wherein the width is within a range extending from about 0.125 inch to about 1.5 inches.

10. The articulated direct-mount inductor as recited in claim 9, wherein the width of the coil portion is larger than the thickness of the coil portion.

11. The articulated direct-mount inductor as recited in claim 10, wherein the width of the coil portion is measured along a surface of the coil portion that is oriented parallel to the z-axis of the Cartesian coordinate system.

12. The articulated direct-mount inductor as recited in claim 1, wherein the first mounting structure includes multiple mounting regions configured to respectively mount in physical and electrical contact with terminals of a first set of multiple electrical components.

13. The articulated direct-mount inductor as recited in claim 12, wherein the second mounting structure includes multiple mounting regions configured to respectively mount in physical and electrical contact with terminals of a second set of multiple electrical components.

14. The articulated direct-mount inductor as recited in claim 13, wherein the first set of multiple electrical components includes two variable capacitors, and wherein the second set of multiple electrical components includes two variable capacitors, wherein each of the two variable capacitors of the first set of multiple electrical components and each of the two variable capacitors of the second set of multiple electrical components has a substantially cylindrical shape extending between two end portions, and wherein the first mounting surface of the first mounting region is shaped to mount on end portions of the two variable capacitors of the first set of multiple electrical components, and wherein the second mounting surface of the second mounting region is shaped to mount on end portions of the two variable capacitors of the second set of multiple electrical components.

15. A method for configuring an impedance matching system, comprising:
   having an articulated direct-mount inductor that includes a coil portion of an electrically conductive material, the articulated direct-mount inductor including a first articulation portion of the electrically conductive material extending from the coil portion, wherein the first articulation portion includes a twist of the electrically conductive material of about ninety degrees, a first bend of the electrically conductive material of about ninety degrees in a first direction, and a second bend of the electrically conductive material of about ninety degrees in a second direction that is opposite of the first direction, the articulated direct-mount inductor including a first mounting structure of the electrically conductive material extending from the first articulation portion, the first mounting structure including a first mounting region having a first mounting surface configured to mount in physical and electrical contact with a terminal of a first electrical component, wherein the first articulation portion orients the first mounting surface of the first mounting region parallel to an x-y plane of a Cartesian coordinate system, with the centerline of the coil portion oriented parallel to a z-axis of the Cartesian coordinate system, the articulated direct-mount inductor including a second articulation portion of the electrically conductive material extending from the coil portion, wherein the second articulation portion includes a twist of the electrically conductive material of about ninety degrees, the articulated direct-mount inductor including a second mounting structure of the electrically conductive material extending from the second articulation portion, the second mounting structure including a second mounting region having a second mounting surface configured to mount in physical and electrical contact with a terminal of a second electrical component, wherein the second articulation portion orients the second mounting surface of the second mounting structure parallel to the x-y plane of the Cartesian coordinate system, wherein each of the coil portion, the first articulation portion, the first mounting structure, the second articulation portion, and the second mounting structure is formed from one piece of the electrically conductive material; and connecting the articulated direct-mount inductor within the impedance matching system so that first mounting region mounts in physical and electrical contact with the terminal of the first electrical component, and the second mounting region mounts in physical and electrical contact with the terminal of the second electrical component.

16. The method as recited in claim 15, further comprising:
   directing a flow of cooling air through the coil portion in a direction along the z-axis of the Cartesian coordinate system.

* * * * *